United States Patent
Nakamura

(10) Patent No.: US 8,970,095 B2
(45) Date of Patent: Mar. 3, 2015

(54) PIEZOELECTRIC ACTUATOR INCLUDING X-GRADED TIO$_X$ ADHESIVE LAYER AND ITS MANUFACTURING METHOD

(75) Inventor: Susumu Nakamura, Yokohama (JP)

(73) Assignee: Stanley Electric Co., Ltd., Tokyo (JP)

( * ) Notice: Subject to any disclaimer, the term of this patent is extended or adjusted under 35 U.S.C. 154(b) by 544 days.

(21) Appl. No.: 13/399,138

(22) Filed: Feb. 17, 2012

(65) Prior Publication Data

US 2012/0212108 A1 Aug. 23, 2012

(30) Foreign Application Priority Data

Feb. 23, 2011 (JP) ................... 2011-036653

(51) Int. Cl.
 *H01L 41/047* (2006.01)
 *H01L 41/22* (2013.01)
 *H01L 41/187* (2006.01)

(52) U.S. Cl.
 USPC .............. 310/364; 29/25.35; 310/358

(58) Field of Classification Search
 USPC .............. 310/358, 363–365; 29/25.35
 See application file for complete search history.

(56) References Cited

U.S. PATENT DOCUMENTS

| | | | |
|---|---|---|---|
| 6,316,866 B1 * | 11/2001 | Sakamaki et al. | ............. 310/358 |
| 6,599,757 B1 | 7/2003 | Murai | |
| 6,730,524 B2 | 5/2004 | Murai | |
| 6,767,085 B2 | 7/2004 | Murai | |
| 6,767,086 B2 | 7/2004 | Murai | |
| 6,803,702 B2 * | 10/2004 | Qiu et al. | ............. 310/358 |
| 6,880,920 B2 | 4/2005 | Murai | |
| 2004/0173823 A1 | 9/2004 | Murai | |
| 2011/0143146 A1 | 6/2011 | Harigai et al. | |
| 2011/0220734 A1 | 9/2011 | Yonemura et al. | |

FOREIGN PATENT DOCUMENTS

| | | | |
|---|---|---|---|
| JP | 05114749 | A | 5/1993 |
| JP | 10290033 | A | 10/1998 |
| JP | 2000-094681 | A | 4/2000 |
| JP | 3517876 | B2 | 4/2001 |
| JP | 2001-223403 | A | 8/2001 |
| JP | 4138196 | B2 | 8/2001 |
| JP | 2002-185285 | A | 6/2002 |
| JP | 2003-081694 | A | 3/2003 |
| JP | 2003-179278 | A | 6/2003 |

(Continued)

OTHER PUBLICATIONS

U.S. Appl. No. 13/751,845, filed Jan. 28, 2013; Title: "Piezoelectric Actuator Including Ti/TiO$_x$ Adhesive Layer and Its Manufacturing Method"; First Named Inventor: Susumu Nakamura.

(Continued)

*Primary Examiner* — Thomas Dougherty
(74) *Attorney, Agent, or Firm* — Holtz, Holtz, Goodman & Chick PC

(57) ABSTRACT

In a piezoelectric actuator including a substrate, an insulating layer formed on the substrate, an adhesive layer formed on the insulating layer, a Pt lower electrode layer formed on the adhesive layer, and a PZT piezoelectric layer formed on the Pt lower electrode layer, the adhesive layer is made of TiO$_x$ having a composition x which is graded so that the composition x on the side of thio insulating layer is larger than the composition x on the side of the Pt lower electrode layer.

8 Claims, 20 Drawing Sheets

(56) References Cited

FOREIGN PATENT DOCUMENTS

| JP | 2003243741 A | 8/2003 |
| JP | 2007042784 A | 2/2007 |
| JP | 2008042069 A | 2/2008 |
| WO | 2010122707 A1 | 10/2010 |

OTHER PUBLICATIONS

Japanese Office Action dated Dec. 25, 2014, issued in counterpart Japanese Application No. 2011-036653.

* cited by examiner

PIEZOELECTRIC ACTUATOR INCLUDING X-GRADED TIO$_X$ ADHESIVE LAYER AND ITS MANUFACTURING METHOD

This application claims the priority benefit under 35 U.S.C. §119 to Japanese Patent Application No. JP2011-036653 filed on Feb. 23, 2011, which disclosure is hereby incorporated in its entirety by reference.

BACKGROUND

1. Field

The presently disclosed subject matter relates to a piezoelectric actuator including lead titanate zirconate (PZT) and its manufacturing method.

2. Description of the Related Art

Lead titanate zirconate PbZr$_x$Ti$_{1-x}$O$_3$ (PZT), which is an oxide compound including lead (Pb), zirconium (Zr) and titanium (Ti), has a simple cubic-system perovskite crystal structure as illustrated in FIG. 8. In FIG. 8, note that a shaded sphere indicates Pb, a black sphere indicates Zr or Ti, and a white sphere indicates 0. As illustrated in FIG. 9, which is a graph for showing an X-ray diffractive pattern of PZT, PZT generates a polarization when PZT is distorted along its <100> direction or <111> direction, thus exhibiting an excellent piezoelectric characteristic when PZT has an orientation of (100) or (111) (see: FIGS. 5 and 10 of JP2003-81694A). That is, the crystal structure of PZT constitutes a tetragonal-system or a rhombohedral-system. In the tetragonal-system crystal structure of PZT, the largest piezoelectric displacement is obtained along the <100> direction (the a-axis direction) (or the <001> direction (the c-axis direction)), while, in the rhombohedral-system crystal structure of PZT, the largest piezoelectric displacement is obtained along the <111> direction. Also, as to the breakdown voltage characteristic which is an important characteristic for piezoelectric actuators, titanium (Ti)-rich (x<0.5) tetragonal-system PZTs are advantageous over rhombohedral-system PZTs. Therefore, PZT piezoelectric layers using such tetragonal-system PZTs are used for micro electro mechanical systems (MEMS) elements as actuators, MEMS elements as sensors, electricity generating elements, gyro elements and so on.

In FIG. 10, which is a cross-sectional view illustrating a prior art piezoelectric actuator, this piezoelectric actuator is of a laminated capacitor type which includes a monocrystalline silicon substrate 1, a silicon oxide (SiO$_2$) layer 2, a titanium (Ti) adhesive layer 3, a platinum (Pt) lower electrode layer 4, a tetragonal-system PZT piezoelectric layer 5 and a Pt upper electrode layer 6. In this case, the monocrystal line silicon substrate 1 can be replaced by a silicon-on-insulator (SOI) substrate. Also, since the silicon oxide layer 2 has bad adhesion characteristics with the Pt lower electrode layer 4, the Ti adhesive layer 3 is interposed therebetween in order to improve the adhesion characteristics between the silicon oxide layer 2 and the Pt lower electrode layer 4 and relax a stress therebetween.

In FIG. 10, when the direction of the PZT piezoelectric layer 5 as indicated by an arrow is along the <100> direction or the <001> direction, distortion is effectively generated by applying a DC voltage between the Pt lower electrode layer 4 and the Pt upper electrode layer 6.

A method for manufacturing the piezoelectric actuator of FIG. 10 is explained next with reference to FIG. 11.

First, referring to step 1101, a monocrystalline silicon substrate 1 is thermally oxidized to grow a silicon oxide (SiO$_2$) layer 2 thereon. In this case, not that a chemical vapor deposition (CVD) process can be used instead of the thermal oxidization process.

Next, referring to step 1102, a Ti adhesive layer 3 is formed by a sputtering process using Ar gas on the silicon oxide layer 2.

Next, referring to step 1103, a Pt lower electrode layer 4 is formed by a sputtering process using Ar gas on the Ti adhesive layer 3.

Next, referring to step 1104, before an arc discharge reactive ion plating (ADRIP) main process at step 1105 for forming a PZT piezoelectric layer 5, an ADRIP pre-process is carried out in an ADRIP apparatus in a vacuum atmosphere to heat the monocrystalline silicon substrate 1, the silicon oxide layer 2, the Ti adhesive layer 3 and the Pt lower electrode layer 4 to about 500° C. This ADRIP pre-process will be described later.

Next, referring to step 1105, the ADRIP main-process is carried out in the same ADRIP apparatus subsequent to the ADRIP pre-process at step 1104 to form a PZT piezoelectric layer 5. This ADRIP main-process will also be described later.

Finally, referring to step 1106, a Pt upper electrode layer 6 is formed by a sputtering process using Ar gas on the PZT piezoelectric layer 5.

The ADRIP main-process at step 1105 has an advantage in that the deposition speed of PZT is higher than the sputtering process. Also, the ADRIP main-process has an advantage in that the substrate temperature is lower, the manufacturing cost is lower, it is more eco-efficient and more efficient in utilization of materials over the metal organic chemical vapor deposition (MOCVD) process using poisonous organic metal gas.

An ADRIP apparatus used for carrying out the ADRIP pre-process at step 1104 and the APRIP main-process at step 1105 is explained next with reference to FIG. 12 (see: FIG. 1 of JP2001-234331A).

In FIG. 12, provided at a bottom portion of a vacuum chamber 1201 is a Pb evaporation source 1202-1, a Zr evaporation source 1202-2 and a Ti evaporation source 1202-3 for independently evaporating Pb, Zr and Ti, respectively.

The Pb evaporation source 1202-1, the Zr evaporation source 1202-2 and the Ti evaporation source 1202-3 are associated with a Pb evaporation amount sensor 1202-1S, a Zr evaporation amount sensor 1202-2S and a Ti evaporation amount sensor 1202-3S, respectively, for detecting Pb, Zr and Ti evaporation amounts within the vacuum chamber 1201.

Also, provided at an upper portion of the vacuum chamber 1201 is a heater incorporating wafer rotating holder 1203 for mounting a wafer 1203a.

Further, provided at an upstream side of the vacuum chamber 1201 are a pressure gradient type arc discharge plasma gun 1204 for introducing insert gas such as Ar gas and He gas thereinto and an O$_2$ gas inlet pipe 1205 for introducing O$_2$ gas thereinto as material for the PZT piezoelectric layer 5. The amount of O$_2$ gas introduced into the vacuum chamber 1201 is adjusted by an adjusting valve 1205a. On the other hand, provided at a downstream side of the vacuum chamber 1201 is an exhaust pipe 1206 coupled to a vacuum pump (not shown).

A control unit 1207 such as a microcomputer is provided to control the entire ADRIP apparatus of FIG. 12. Particularly, the control unit 1207 receives signals from the evaporation amount sensors 1202-1S, 1202-2S and 1202-3S to control the evaporation sources 1202-1, 1202-2 and 1202-3 as well as the pressure gradient type arc discharge plasma gun 1204 and the adjusting valve 1205a.

When the ADRIP apparatus of FIG. 12 carries out the ADRIP main-process at step 1105 of FIG. 11, the control unit 1207 operates the pressure gradient type arc plasma gun 1204 to receive Ar gas and He gas and generate arc discharge plasma 1208 at a high electron density and at a low electron temperature. Also, the control unit 1207 operates the adjusting valve 1205a to introduce $O_2$ gas into the vacuum chamber 1201. As a result, a large amount of active atoms and active molecules such as oxygen radicals are generated. On the other hand, Pb vapor, Zr vapor and Ti vapor generated from the Pb evaporation source 1202-1, the Zr evaporation source 1202-2 and the Ti evaporation source 1202-3 react with the above-mentioned active atoms and active molecules and are deposited on the wafer 1203a heated at about 500° C. As a result, $PbZr_xTi_{1-x}O_3$ with a composition ratio x is formed on the wafer 1203a.

The piezoelectric actuator of FIG. 10 is heated by the ADRIP pre-process and the ADRIP main-process at steps 1104 and 1105 to about 500° C. As a result, as illustrated in FIG. 13, Ti of the Ti adhesive layer 3 is diffused into the Pt lower electrode layer 4. Also, Pb of the PZT piezoelectric layer 5 reacts with the Pt lower electrode layer 4 and is further diffused into the Ti adhesive layer 3 and the silicon oxide layer 2.

As illustrated in FIG. 14, which shows the element concentration distribution within the piezoelectric actuator excluding the PZT components of FIG. 10 after the formation of the PZT piezoelectric layer 5, the boundary between the silicon oxide layer 2 and the Ti adhesive layer 3 and the boundary between the Ti adhesive layer 3 and the Pt lower electrode layer 4 are obscure, so that Ti with strong affinity for oxygen gas, nitrogen gas and hydrogen gas absorbs these gases which react with Ti to harden the Ti.

In order to suppress the obscurity of the above-mentioned boundaries, a manufacturing method as illustrated in FIG. 15 may be adopted instead of the manufacturing method as illustrated in FIG. 11. In FIG. 15, note that step 1501 is provided instead of step 1104 of FIG. 11. That is, at step 1501, an ADRIP pre-process is carried out in an oxygen atmosphere. However, even by step 1501 of FIG. 15, as illustrated in FIG. 16, which shows the element concentration distribution within the piezoelectric, actuator excluding the PZT components of FIG. 10 after the formation of the PZT piezoelectric layer 5, the boundary between the silicon oxide layer 2 and the Ti adhesive layer 3 and the boundary between the Ti adhesive layer 3 and the Pt lower electrode layer 4 are still obscure. Note that FIG. 17 shows the element concentration distribution within the piezoelectric actuator including the PZT components of FIG. 10 corresponding to FIG. 16 where the depth corresponds to the etching time of FIG. 17.

Thus, in the prior art piezoelectric actuator of FIG. 10, since atoms other than Ti atoms cannot be sufficiently oxidized in order to secure a clear boundary between the Ti adhesive layer 3 and the Pt lower electrode layer 4, Ti of the Ti adhesive layer 3 and Pb of the PZT piezoelectric layer 5 are diffused into the Pt lower electrode layer 4, and react with Pt of the Pt lower electrode layer 4. As a result, as illustrated in FIG. 18A, the crystallizability of the Pt lower electrode layer 4 greatly fluctuates so that the surface roughness would be increased. Also, as illustrated in FIG. 18B, the crystallizability of the Pt lower electrode, layer 4 within one wafer greatly fluctuates. In FIG. 18B, note that $P_{181}$ indicates a portion where the crystallizability of the Pt lower electrode layer 4 is good, while $P_{182}$ indicates a portion where the crystallizability of the Pt lower electrode layer 4 is bad. Therefore, as illustrated in FIG. 19A, the columnar crystallizability of the PZT piezoelectric layer 5 greatly fluctuates. Also, as illustrated in FIG. 19B, the piezoelectric constant $(-d_{31})$ of the PZT piezoelectric layer 5 within one wafer greatly fluctuates. In FIG. 19B, note that $P_{191}$ indicates a portion where the piezoelectric constant $(-d_{31})$ is high, while $P_{102}$ indicates a portion where the piezoelectric constant $(-d_{31})$ is low. Further, as illustrated in FIG. 20, the surface roughness of the Pt upper electrode layer 6 greatly fluctuates. Therefore, when a DC voltage, is applied between the Pt lower electrode layer 4 and the Pt upper electrode layer 6, a strong electric field would be locally focused so that the breakdown voltage characteristics would deteriorate. Thus, the manufacturing yield would be decreased.

Further, an adhesive layer (buffer layer) of $ZrO_2$ between an insulating substrate and a lower electrode layer is known (see: US2004/0173823A1, JP2001-088291A and JP2003-179278A). In this case, the adhesive layer on the side of the insulating substrate is Zr, while the adhesive layer on the side of the lower electrode layer is $ZrO_3$. Therefore, since the adhesion between the insulating substrate and the adhesive layer and the adhesion between the adhesive layer and the lower electrode layer are carried out by metal-to-insulator bonding such as molecular bonding or electrostatic bonding, these adhesions are very weak. Therefore, when an ADRIP process is applied to such an adhesive layer, the interface between the adhesive layer and the insulating substrate (or the lower electrode layer) would be peeled off due to the high and low temperatures produced by the ADRIP process.

SUMMARY

The presently disclosed subject matter seeks to solve one or more of the above-described problems.

According to the presently disclosed subject matter, in a piezoelectric actuator including a substrate, an insulating layer formed on the substrate, an adhesive layer formed on the insulating layer, a Pt lower electrode layer formed on the adhesive layer, and a PZT piezoelectric layer formed on the Pt lower electrode layer, the adhesive layer is made of $TiO_x$ having a composition x which is graded so that the composition x on the side of the insulating layer is larger than the composition x on the side of the Pt lower electrode layer. Thus, adhesion between the insulating layer and the $TiO_x$ adhesive layer and adhesion between the $TiO_x$ adhesive layer and the Pt lower electrode layer is secured. Also, diffusion of Ti of the $TiO_x$ adhesive layer into the lower electrode layer, diffusion of Pt of the Pt lower electrode layer into the $TiO_x$ adhesive layer, diffusion of Pb of the PZT piezoelectric layer into the Pt lower electrode layer, the $TiO_x$ adhesive layer and the insulating layer are suppressed.

Also, the composition x is continuously graded. In addition, a difference between a maximum value and a minimum value of the composition x within the $TiO_x$ adhesive layer is larger than 0.3. Thus, in spite of the $TiO_x$ adhesive layer being a single layer, adhesion of the $TiO_x$ adhesive layer with the insulating layer and the Pt lower electrode layer becomes strong.

Further, the composition x on the side of the insulating layer is close to 2, and the composition x on the side of the Pt lower electrode layer is close to 0. Particularly, the composition x on the side of the insulating layer is from 1.4 to 2, and the composition x on the side of the Pt, lower electrode layer is from 0 to 1.45. Thus, adhesion between the insulating layer and the $TiO_x$ adhesive layer is carried out by oxide-to-oxide bonding such as covalent bonding or ion bonding, while adhesion between the $TiO_x$ adhesive layer and the Pt lower electrode layer is carried out by metal-to-metal bonding.

On the one hand, in a method for manufacturing a piezoelectric actuator, an insulating layer is formed on a substrate. Then, a $TiO_x$ adhesive layer is formed on the insulating layer by a sputtering process using oxygen gas in such a way that a flow rate of the oxygen gas is decreased from a start timing of the sputtering process to an end timing of the sputtering process. Then, a Pt lower electrode layer is formed on the $TiO_x$ adhesive layer. Finally, a PZT piezoelectric layer is formed on the Pt lower electrode layer.

Also, in the above-mentioned manufacturing method, the flow rate of the oxygen gas in the $TiO_x$ adhesive layer forming is continuously decreased.

Further, in the above-mentioned manufacturing method, before the PZT piezoelectric layer forming, the substrate, the insulating layer, the $TiO_x$ adhesive layer and the Pt lower electrode layer are further heated in an oxygen atmosphere.

According to the presently disclosed subject matter, since the adhesion between the insulating layer and the Pt lower electrode layer is secured by the $TiO_x$ adhesive layer and the diffusion of Ti, Pt and Pb components is suppressed, the boundaries among the insulating layer, the $TiO_x$ adhesive layer and the Pt lower electrode layer can be clarified, so that the deviation of the piezoelectric constant $(-d_{31})$ can be decreased and also, the breakdown voltage characteristics can be improved, thus improving the manufacturing yield.

BRIEF DESCRIPTION OF THE DRAWINGS

The above and other advantages and features of the presently disclosed subject matter will be more apparent from the following description of certain embodiments, taken in conjunction with the accompanying drawings, as compared with the prior art, wherein.

DETAILED DESCRIPTION OF EXEMPLARY EMBODIMENTS

Figure 1:
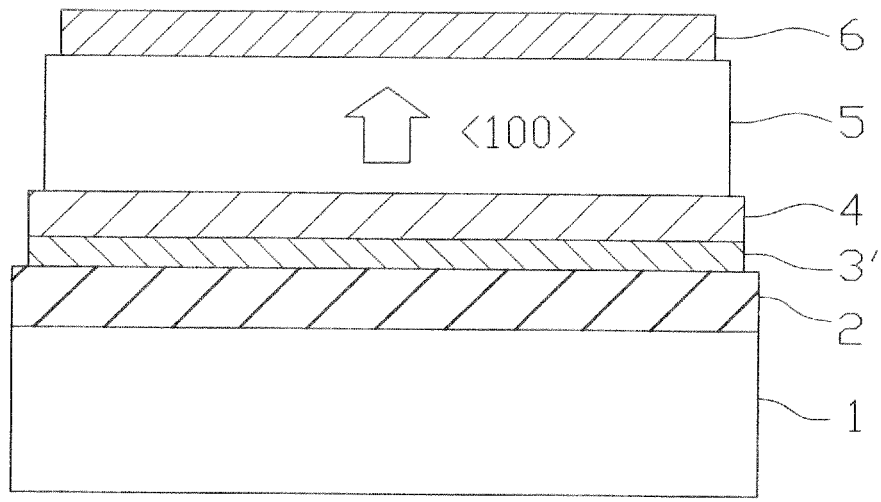
FIG. 1 is a cross-sectional view illustrating an embodiment of the piezoelectric actuator according to the presently disclosed subject matter.
Figure 10:
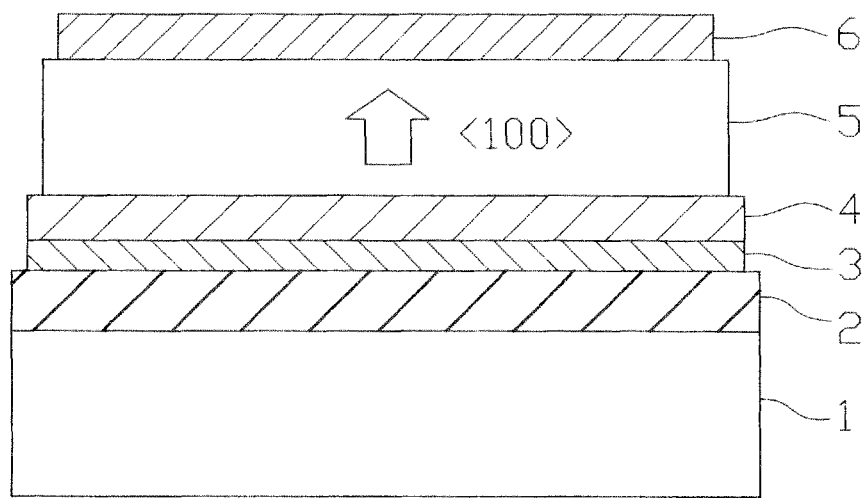
FIG. 10 is a cross sectional view illustrating a prior art piezoelectric actuator.
Figure 11:
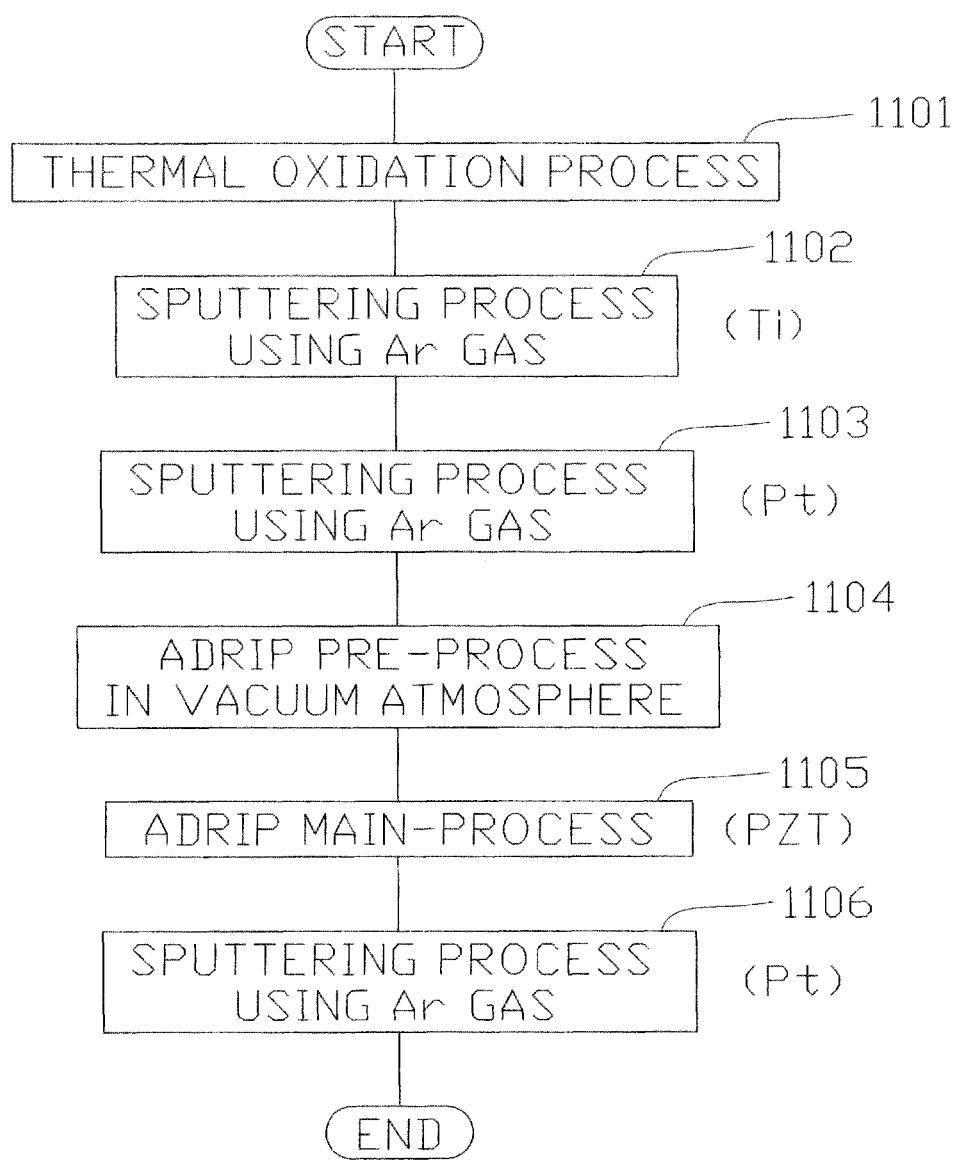
FIG. 11 is a flowchart for explaining a method for manufacturing the piezoelectric actuator of FIG. 10.
Figure 12:
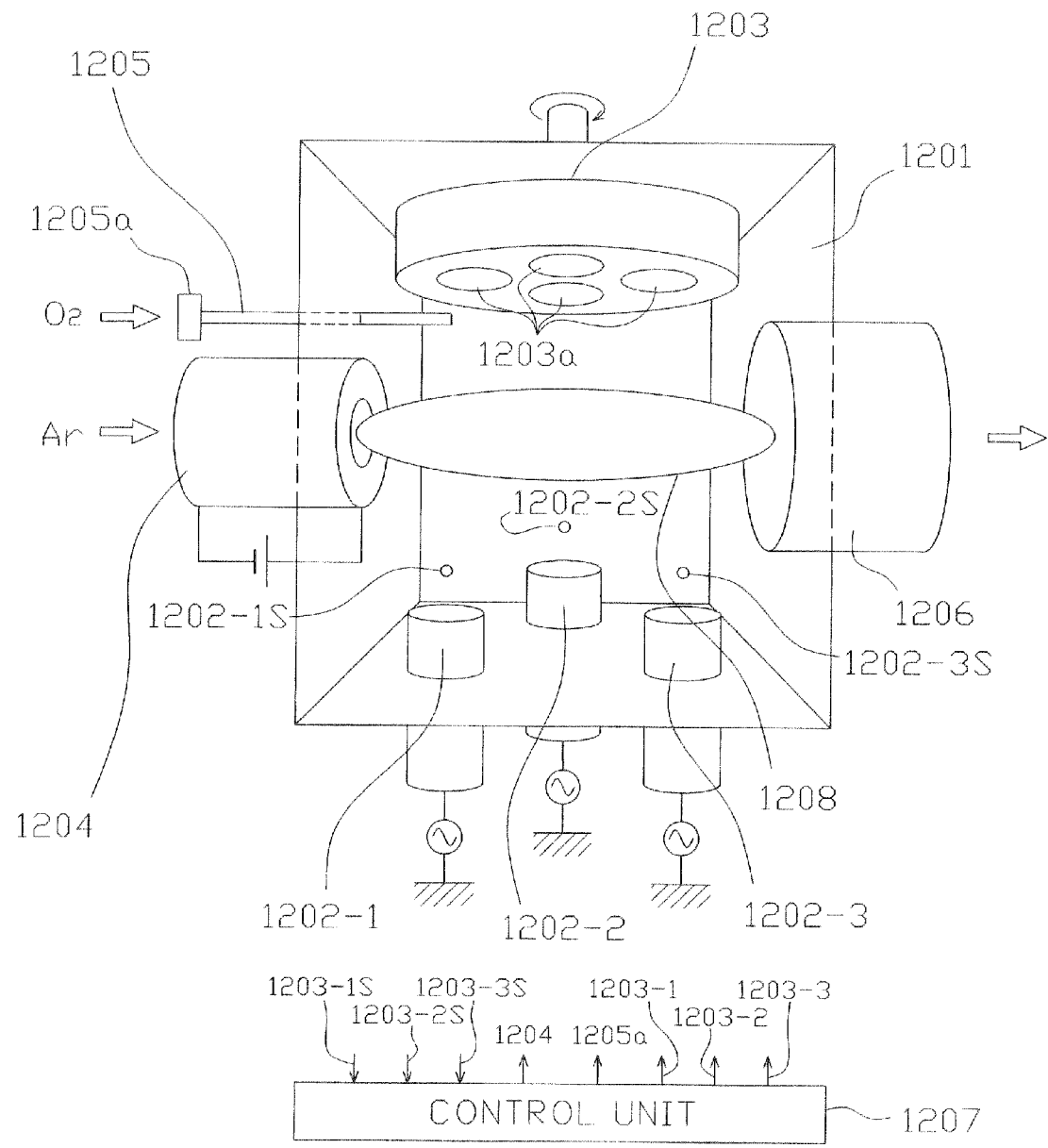
FIG. 12 is a diagram illustrating an ADRIP apparatus used in the ADRIP pre-process step 1104 and the ADRIP main-process step 1105 of FIG. 11.
Figure 13:
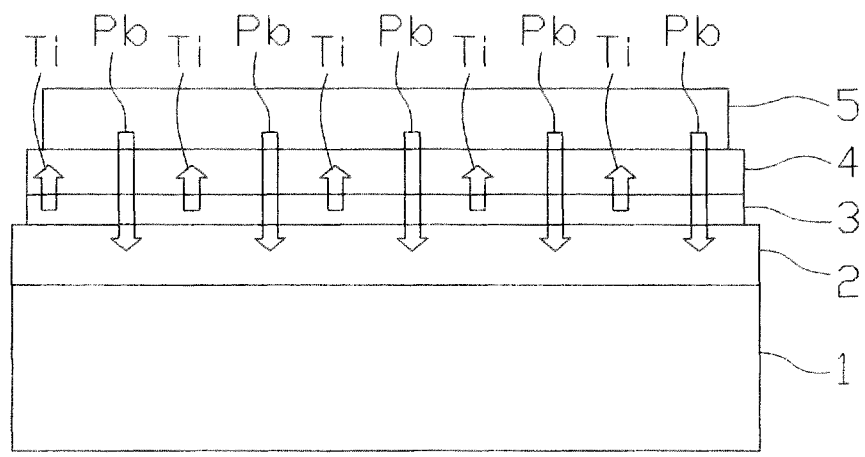
FIG. 13 is a cross-sectional view for explaining the problem in the piezoelectric actuator of FIG. 10.

In FIG. 1, which illustrates an embodiment of the piezoelectric actuator according to the presently disclosed subject matter, a $TiO_x$ ($0 \leq x \leq 2$) adhesive layer 3' is provided instead of the Ti adhesive layer 3 of FIG. 10. That is, the $TiO_x$ adhesive layer 3' is obtained by incompletely oxidizing Ti. In this case, the sheet resistance of the $TiO_x$ adhesive layer 3' is about $2 \times 10^2 \Omega/\square$, for example. The composition x of the $TiO_x$ adhesive layer 3' is graded, for example, is continuously graded. Also, $TiO_x$ of an interface of the $TiO_x$ adhesive layer 3' in contact with the silicon oxide layer 2 is $TiO_2$ (x=2), while, $TiO_x$ of another interface of the $TiO_x$ adhesive layer 3' in contact with the Pt lower electrode layer 4 is Ti (x=0). Therefore, the adhesion between the silicon oxide layer 2 and the $TiO_x$ adhesive layer 3' is carried out by oxide-to-oxide bonding such as covalent bonding or ion bonding, thus securing a strong adhesion, and the adhesion between the $TiO_x$ adhesive layer 3' and the Pt lower electrode layer 4 is carried out by metal-to-metal bonding, thus securing a strong adhesion. Also, the oxygen component of the $TiO_x$ adhesive layer 3' prevents Si of the silicon oxide layer 2 from being diffused into the $TiO_x$ adhesive layer 3', and simultaneously, prevents Ti of the $TiO_x$ adhesive layer 3' from being diffused into the silicon oxide layer 2 and the Pt lower electrode layer 4. Further, Pb of the PZT piezoelectric layer 5 is prevented from being reacted with Pt of the Pt lower electrode layer 4 for their alloys and being diffused thereinto.

Figure 2:
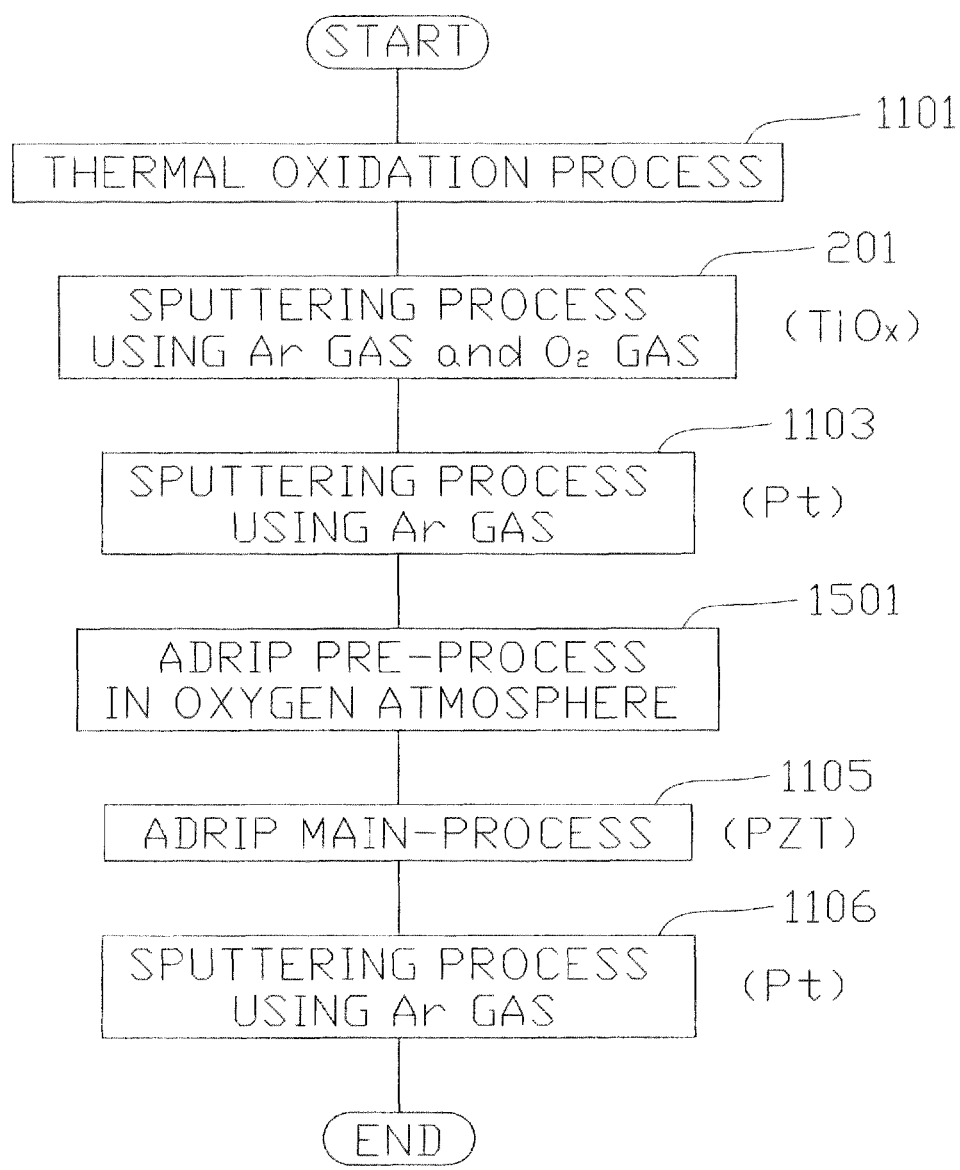
FIG. 2 is a flowchart, for explaining a method for manufacturing the piezoelectric actuator of FIG. 1.
Figure 15:
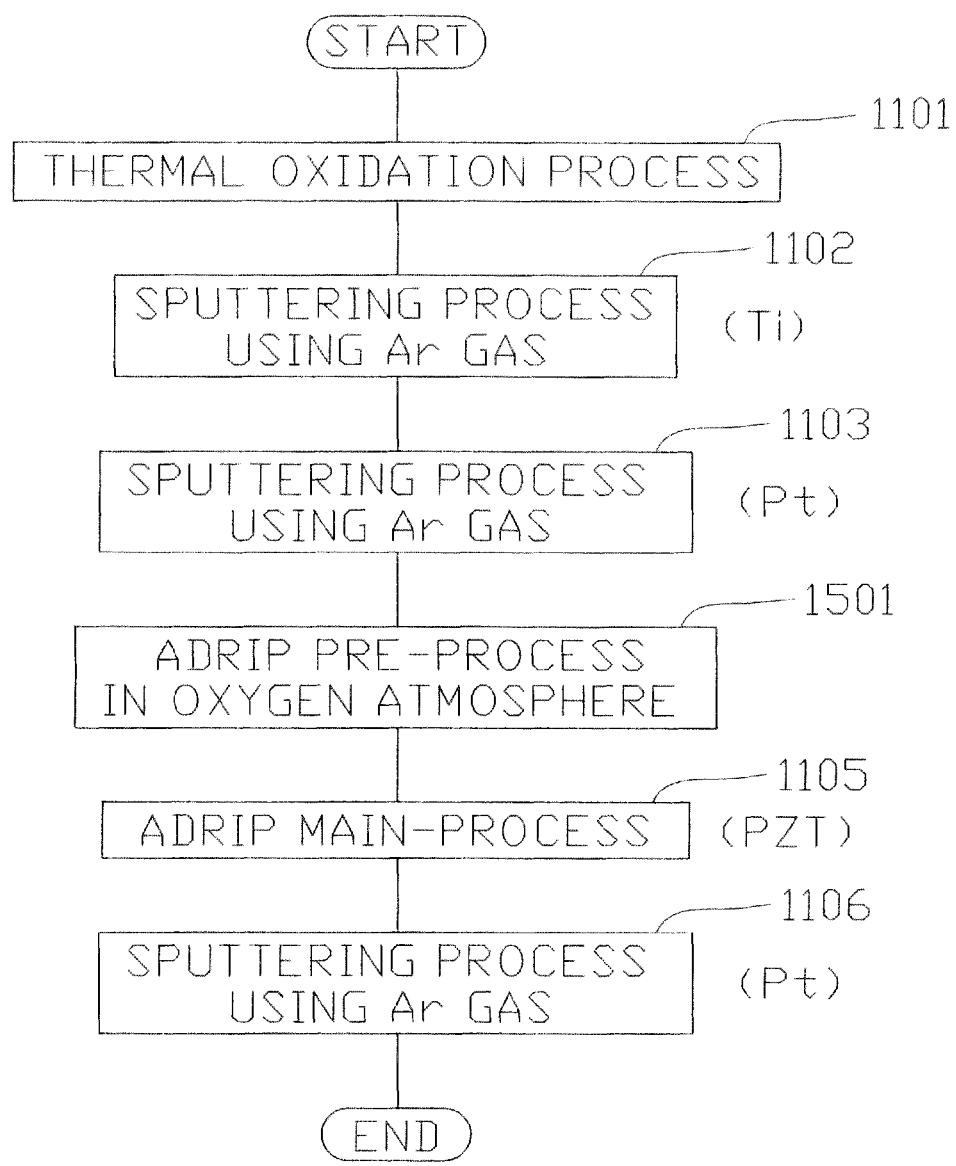
FIG. 15 is a flowchart of a modification of FIG. 11.

In FIG. 2, which is a flowchart for explaining a method for manufacturing the piezoelectric actuator of FIG. 1, a sputtering step 201 using Ar gas and $O_2$ gas is provided instead of the sputtering step 1102 using Ar gas of FIG. 15.

Figure 3:
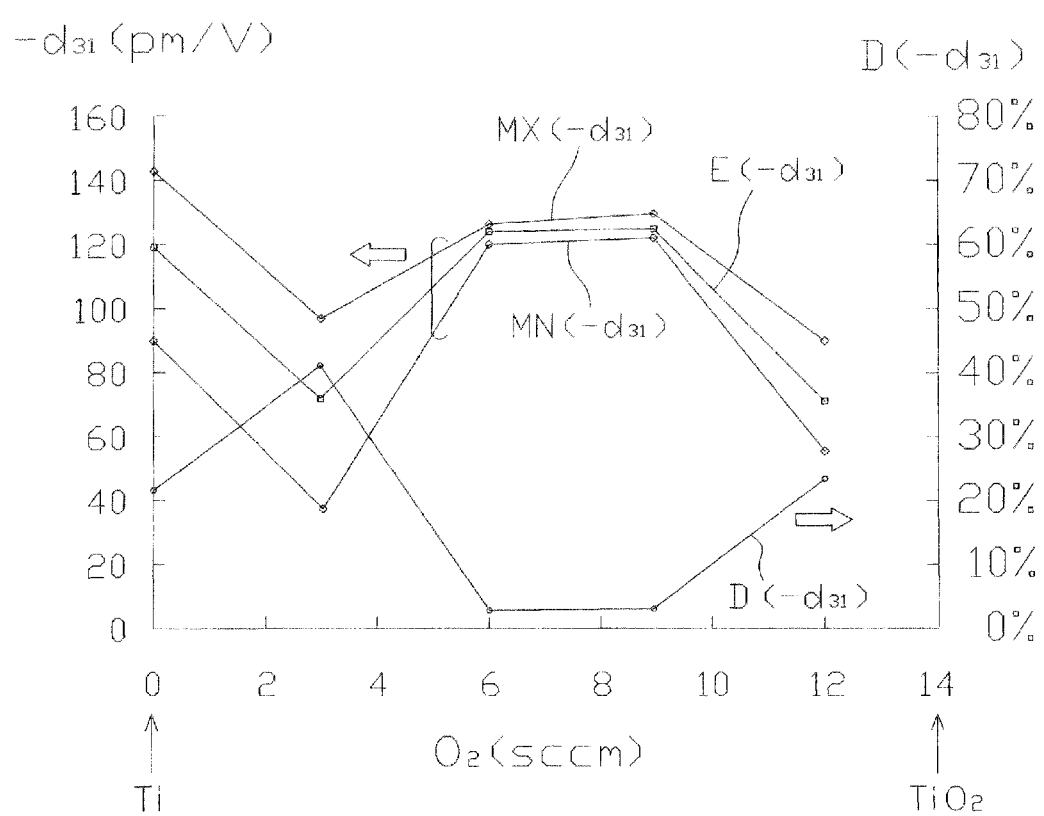
FIG. 3 is a graph for explaining the optimum oxygen gas flow rate in the sputtering step 201 of FIG. 2.

In FIG. 3, which is a graph for explaining the optimum $O_2$ gas flow rate at the sputtering step 201 using Ar gas and $O_2$ gas. As illustrated in FIG. 3, when the $O_2$ gas flow rate is too small, the composition x of $TiO_x$ of the $TiO_x$ adhesive layer 3' is brought close to a range from 0 to 1.45, for example, 0, so that the deviation $D(-d_{S1})$ of the piezoelectric constant $(-d_{31})$ of the PZT piezoelectric layer 5 becomes large. On the other hand, when the $O_2$ gas flow rate is too large, the composition x of $TiO_x$ of the $TiO_x$ adhesive layer 3' is brought close to a range from 1.4 to 2, for example, 2, so that the deviation $D(-d_{31})$ of the piezoelectric constant $(-d_{31})$ of the PZT piezoelectric layer 5 becomes large. In this case, since the adhesion of the $TiO_x$ adhesive layer 3' becomes weak, the $TiO_x$ adhesive layer 3' would be easily peeled off. Here, note that the deviation D is defined as follows:

$$D(-d_{31})=100\%(MX(-d_{31})-MN(-d_{31})/E(-d_{31})$$

where $MX(-d_{31})$ is the maximum value of $(-d_{31})$;
$MIN(-d_{31})$ is the minimum value of $(-d_{31})$; and
$E(-d_{31})$ is the mean value of $(-d_{31})$. Therefore, if the $O_2$ gas flow rate is optimum, i.e., from 6 to 9 sccm, an incomplete $TiO_x$ is obtained so that the deviation $D(-d_{31})$ of the PZT piezoelectric layer 5 is minimum. One approach is to make the composition x of $TiO_x$ of the $TiO_x$ adhesive layer 3' grade. That is, at the beginning of growth of the $TiO_x$ adhesive layer 3', the $O_x$ gas flow rate is large so that. $TiO_x$ is brought close to $TiO_2$ (x=2), while at the end of growth of the $TiO_x$ adhesive layer 3', the $O_2$ gas flow rate is small so that. $TiO_x$ is brought close to Ti (x=0). Also, during an intermediate time period between the beginning and the end of growth, the $O_2$ gas flow rate is gradually decreased, i.e., the $O_2$ as flow rate is graded with respect to time, so that the composition x is continuously graded. As a result, the silicon oxide layer 2 and the $TiO_x$ adhesive layer 3' are combined by oxide-to-oxide bonding such as covalent bonding or ion bonding so that the adhesion between the silicon oxide layer 2 and the $TiO_x$ adhesive layer 3' is strong. Also, the $TiO_x$ adhesive layer 3' and the Pt lower electrode layer 4 are combined by metal-to metal bonding so that the adhesion between the $TiO_x$ adhesive layer 3' and the Pt lower electrode layer 1 is strong.

In the above-case, the difference between a maximum value and a minimum value of the composition x is preferably larger than 0.3. Thus, in spite of the $TiO_x$ adhesive layer 3' being a single layer, adhesion of the $TiO_x$ adhesive layer 3' with the silicon oxide layer 2 and the Pt lower electrode layer 4 becomes strong.

Also, at the ADRIP pre-process step 1501 in an oxygen atmosphere, Ti and its incomplete oxide of the $TiO_x$ adhesive layer 3' OH the side of the Pt lower electrode layer 4 are further oxidized to suppress the diffusion of Ti into the adjacent layers of the $TiO_x$ adhesive layer 3'. As a result, it is avoided for Pb adhered to the silicon oxide layer 2 and so on to be diffused into the silicon oxide layer 2 and monocrystalline silicon substrate 1 during the ADRIP main-process step 1105, thus preventing the crystallizability of the Pt lower electrode layer 4 from being damaged. In this case, however, the composition x of $TiO_x$ of the $TiO_x$ adhesive layer 3' on the side of the Pt tower electrode layer 4 is still smaller than 2, so that only a small amount of Ti is diffused into the Pt lower electrode layer 4, thus maintaining the adhesion between the $TiO_x$ adhesive layer 3' and the Pt lower electrode layer 4.

Figure 4:
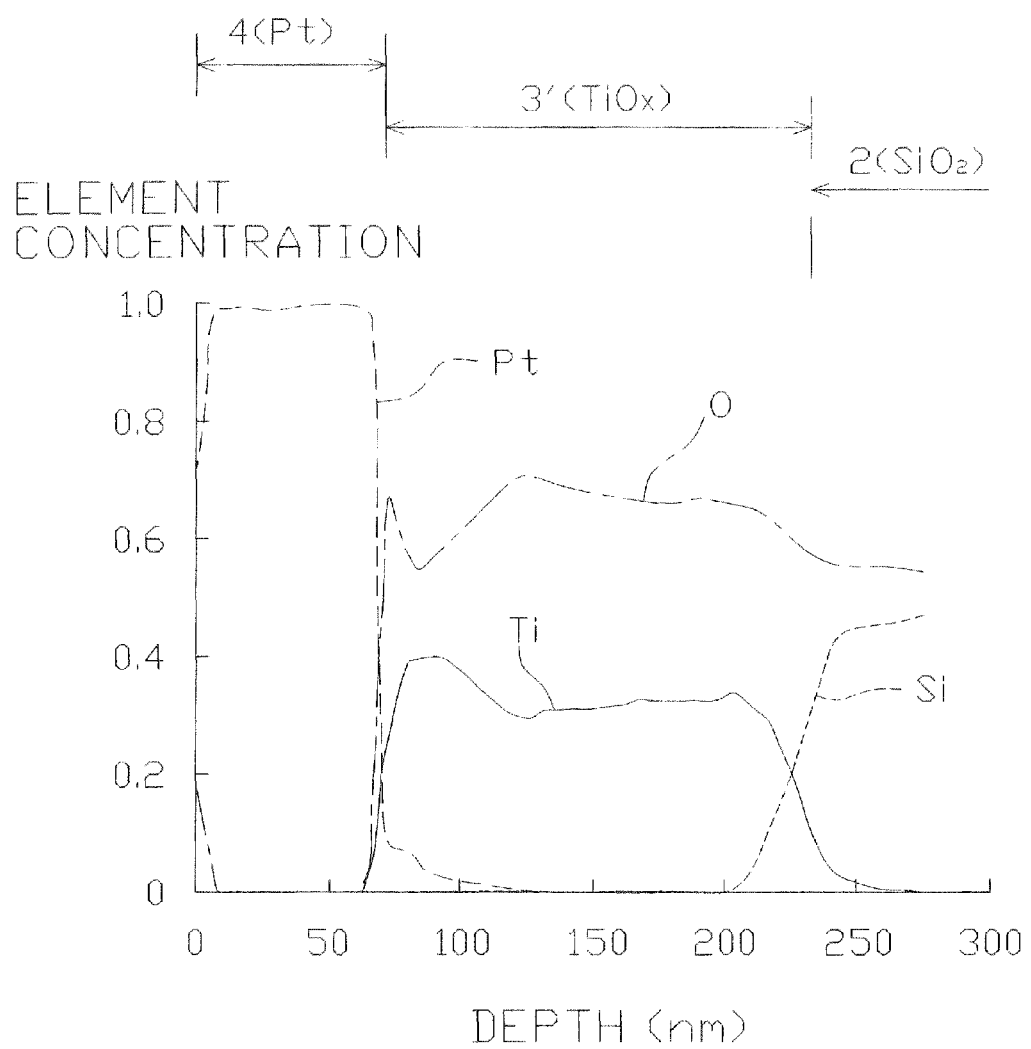
FIG. 4 is an X-ray photoelectric spectroscopy (XPS) analysis graph showing the element concentration of the piezoelectric actuator of FIG. 1 excluding the PZT components.
Figure 5:
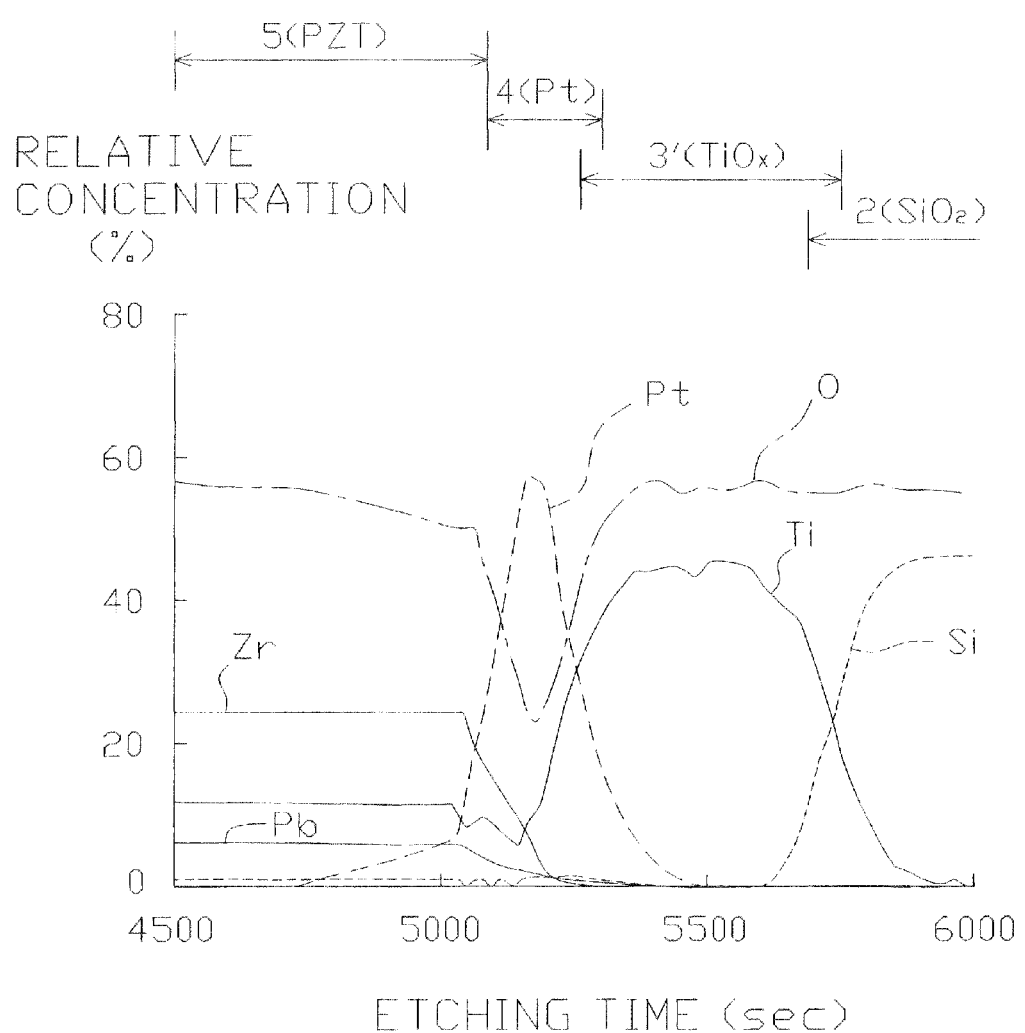
FIG. 5 is an X-ray photoelectric spectroscopy (XPS) analysis graph showing the element concentration distribution along the depth direction of the piezoelectric actuator of FIG. 1 including the PZT components.
Figure 14:
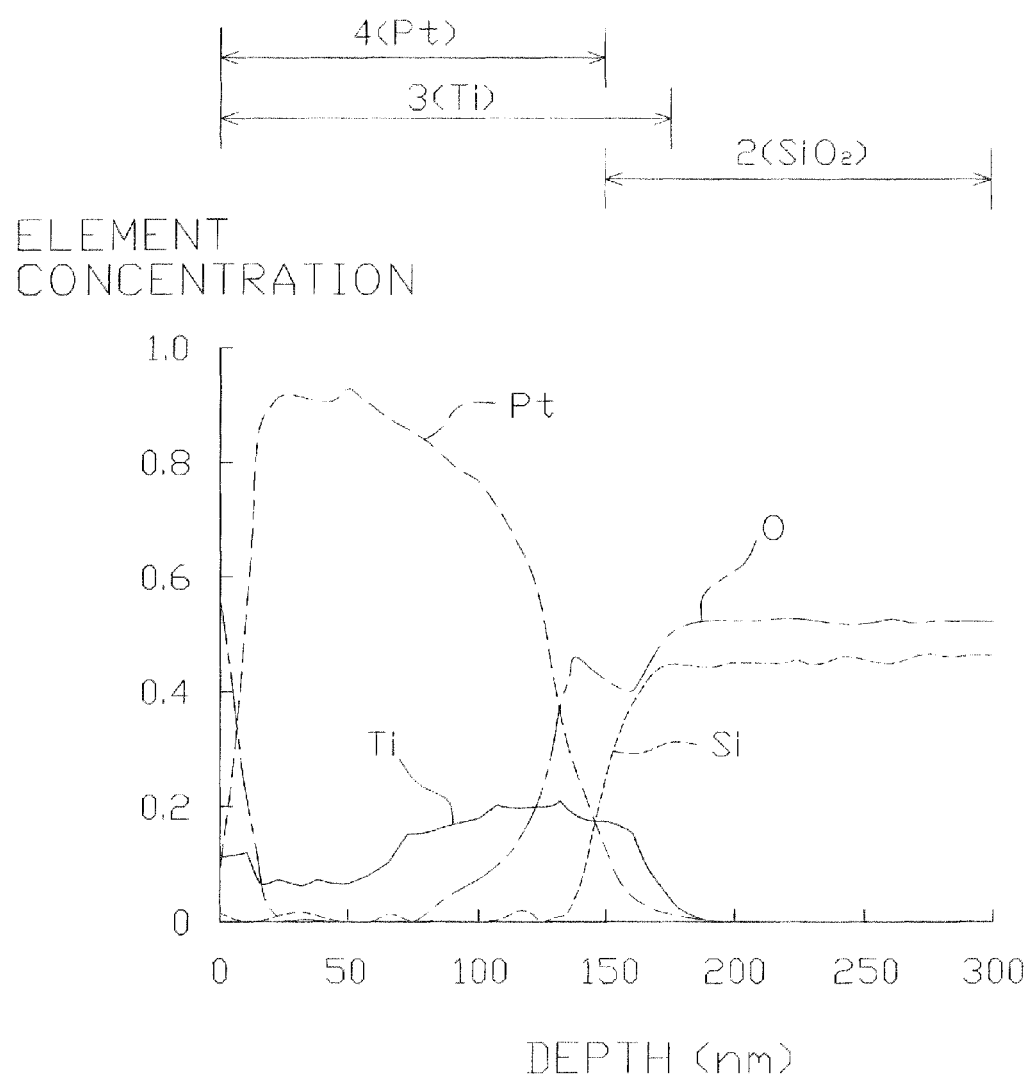
FIG. 14 is an X-ray photoelectric spectroscopy (XPS) analysis graph showing the element concentration distribution along the depth direction of the piezoelectric actuator of FIG. 10 excluding the PZT components.
Figure 16:
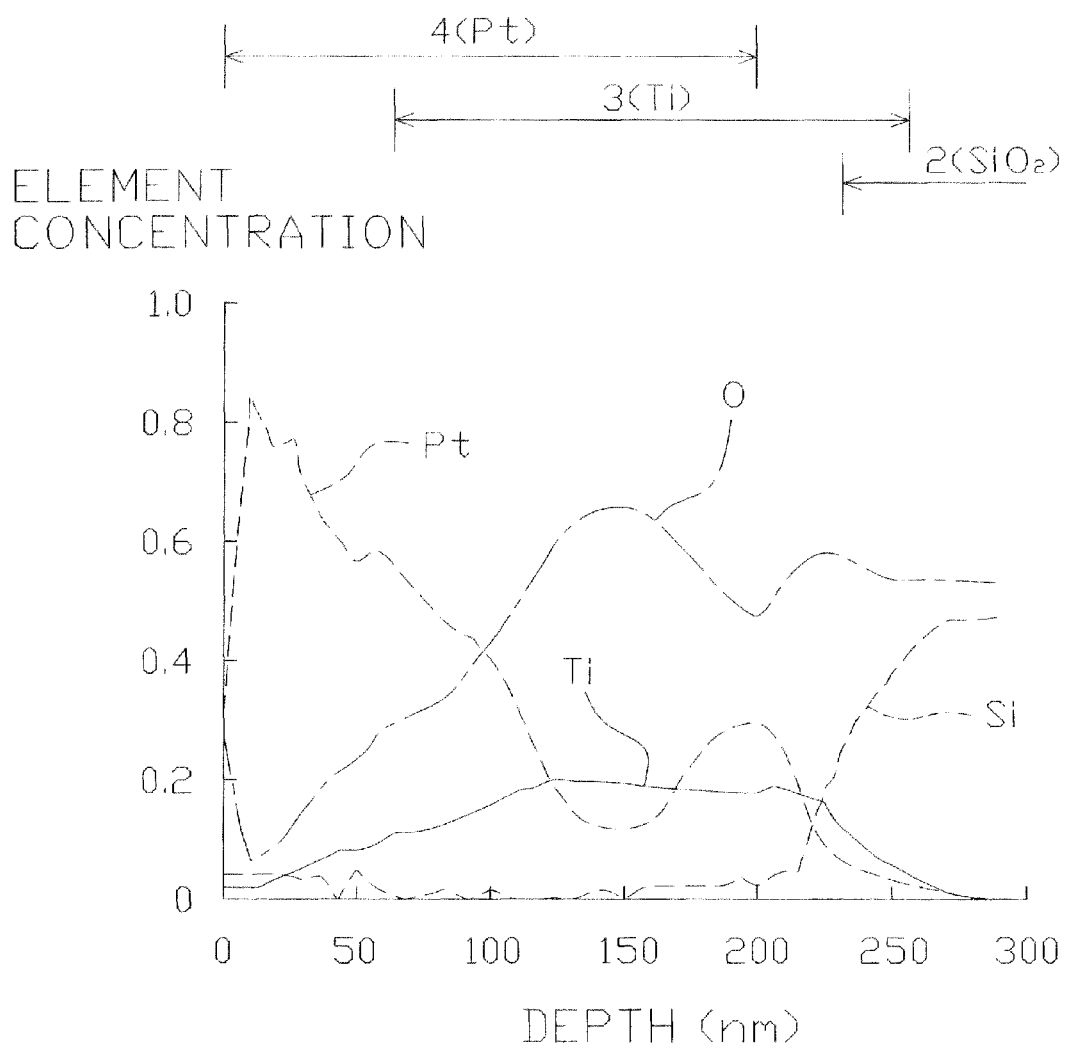
FIG. 16 is another X-ray photoelectric spectroscopy (XPS) analysis graph showing the element concentration distribution along the depth direction of the piezoelectric actuator of FIG. 10 excluding the PZT components.
Figure 17:
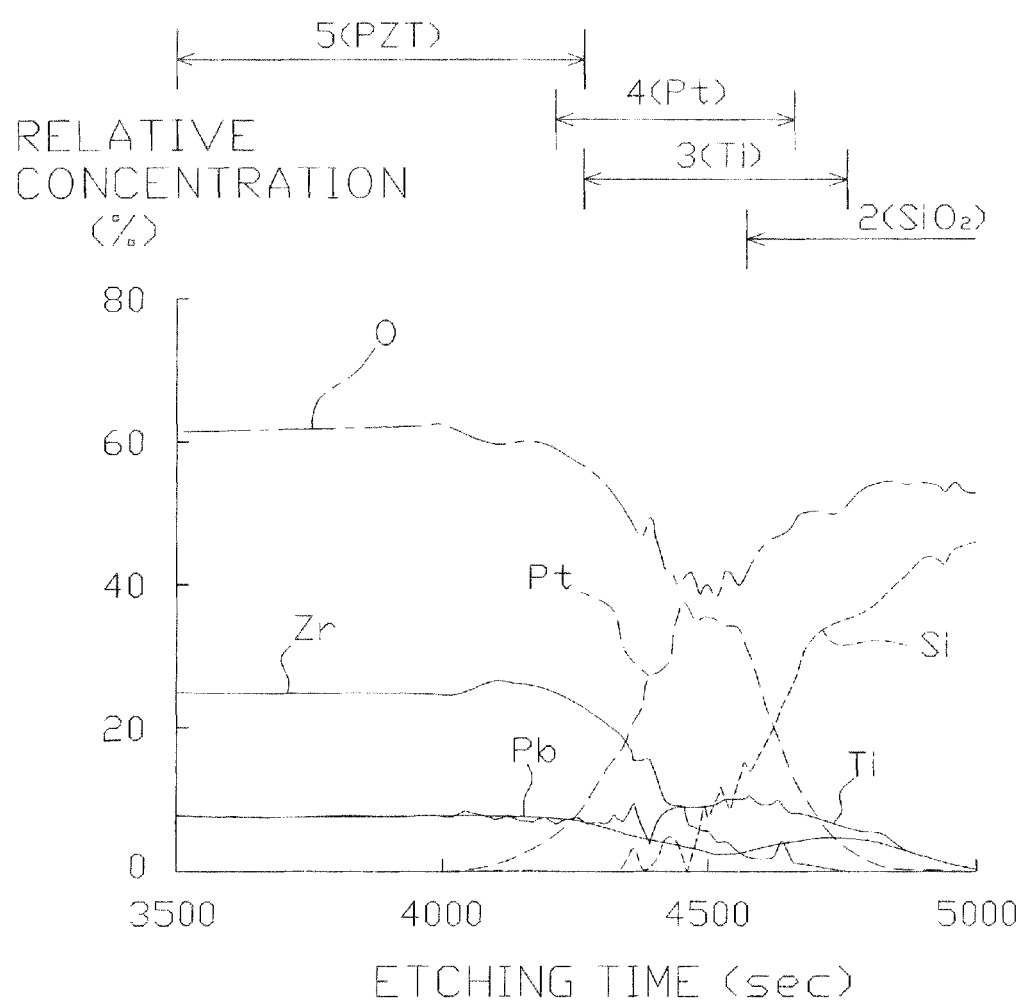
FIG. 17 is an X-ray photoelectric spectroscopy (XPS) analysis graph showing the element concentration distribution along the depth direction of the piezoelectric actuator of FIG. 10 including the PZT components.

According to the above-mentioned embodiment, the diffusion of Ti of the $TiO_x$ adhesive layer into the silicon oxide layer 2 and the Pt lower electrode layer 4 is suppressed by the oxygen component of the $TiO_x$ adhesive layer 3' per se, and the diffusion of Pb of the PZT piezoelectric layer 5 into the $TiO_x$ adhesive layer 3' and the silicon oxide layer 2 is suppressed by the oxygen component of the $TiO_x$ adhesive layer 3' per se. Therefore, as illustrated in FIGS. 4 and 5, the boundaries among she silicon oxide layer 2, the $TiO_x$ adhesive layer 3', the Pt lower electrode layer 4 and the PZT piezoelectric layer 2 become clear. Note that FIG. 4 corresponds to FIGS. 14 and 16, and FIG. 5 corresponds to FIG. 17.

Figure 6:
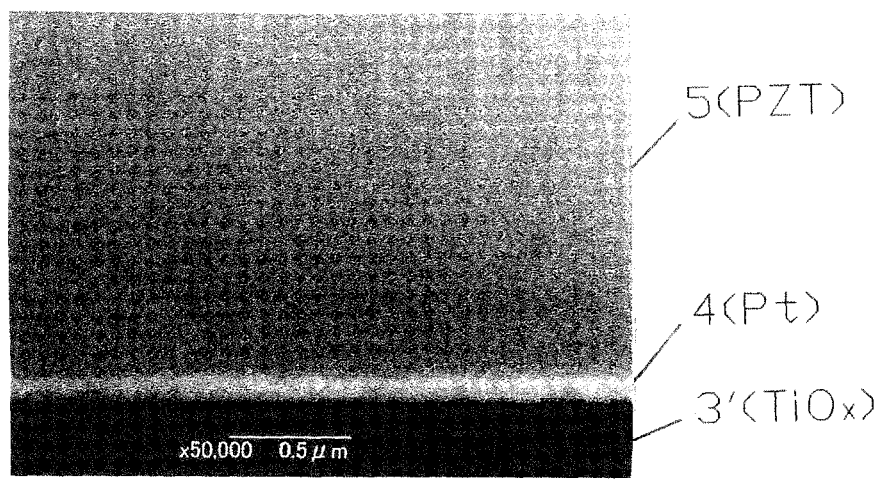
FIG. 6 is a scanning electron microscope (SEM) photograph illustrating a cross section of the $TiO_x$ adhesive layer, the Pt lower electrode layer and the PZT piezoelectric layer of FIG. 1.
Figure 7:
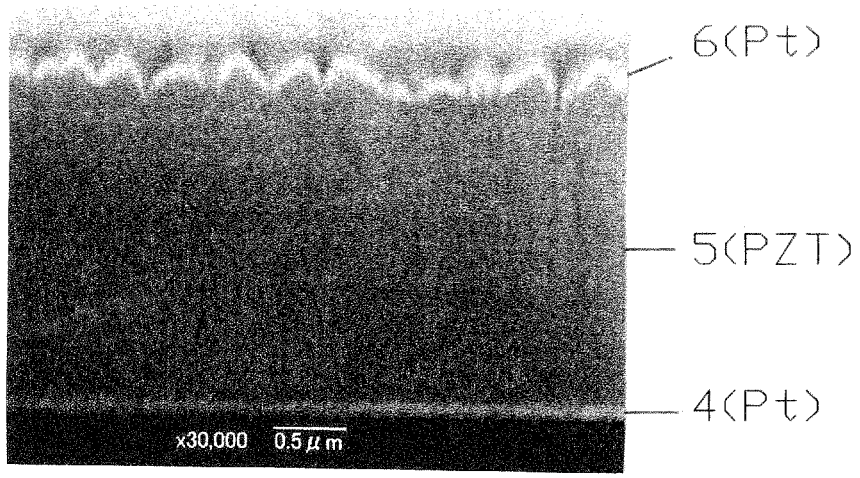
FIG. 7 is a scanning electron microscope (SEM) photograph illustrating a cross section of the Pt lower electrode layer, the PZT piezoelectric layer and the Pt upper electrode layer of FIG. 1.
Figure 8:
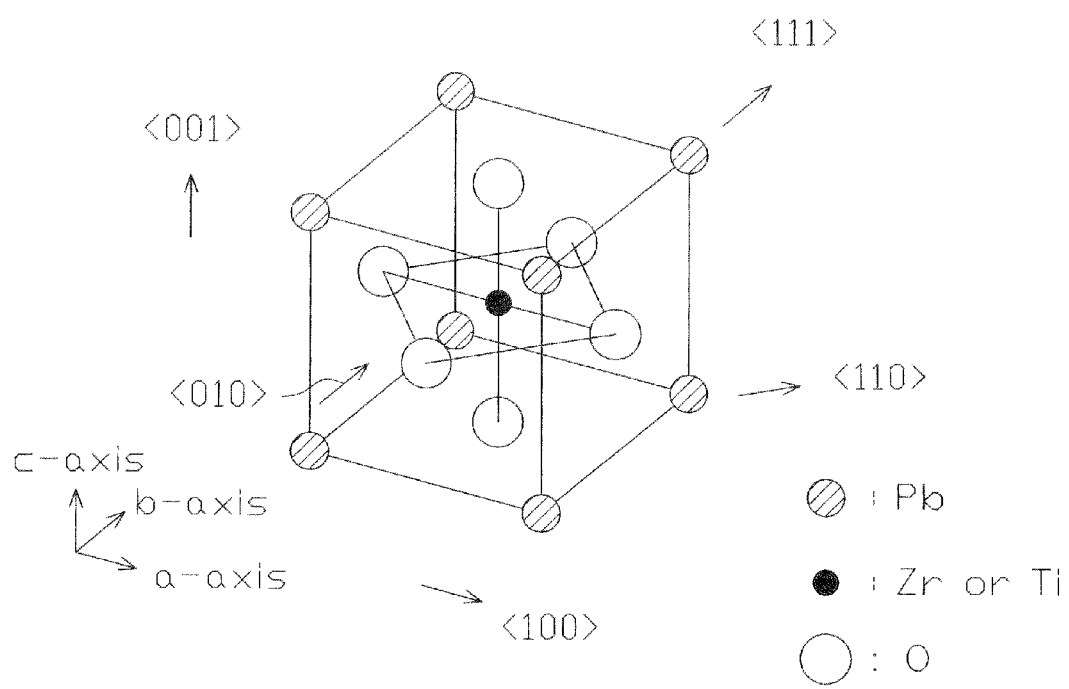
FIG. 8 is a diagram illustrating a crystal structure of PZT.
Figure 9:
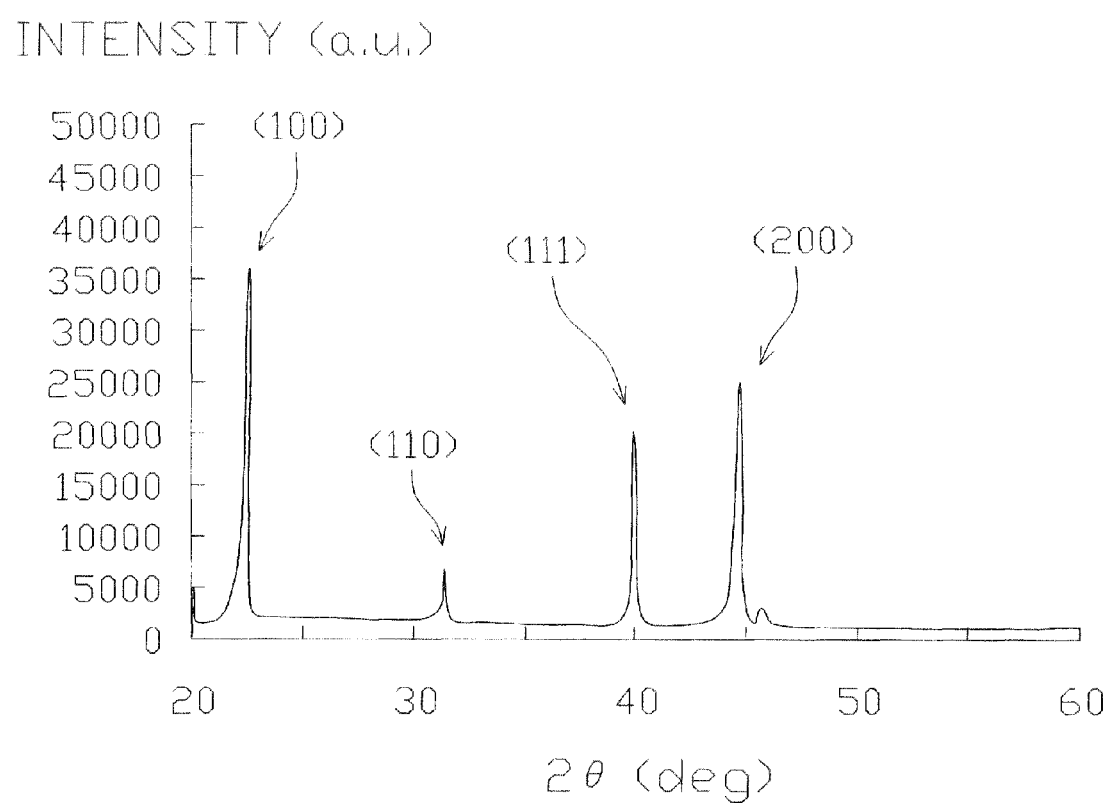
FIG. 9 is a graph illustrating an X-ray diffractive pattern of PZT.
Figure 18A:
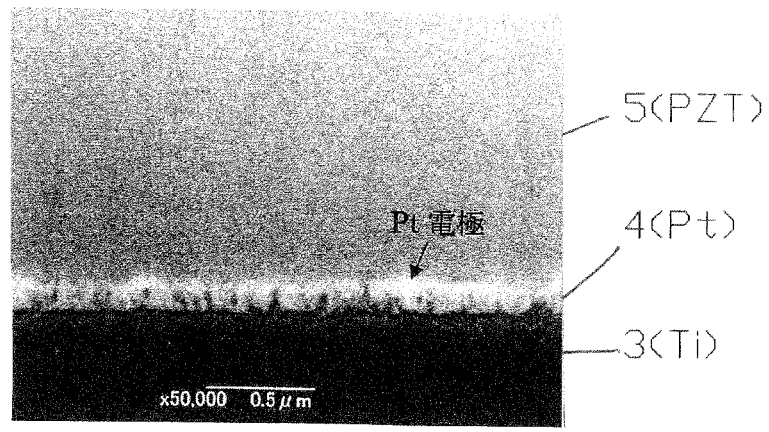
FIG. 18A is a scanning electron microscope (SEM) photograph illustrating a cross section of the Ti adhesive layer, the Pt lower electrode layer and the PZT piezoelectric layer of FIG. 10.
Figure 18B:
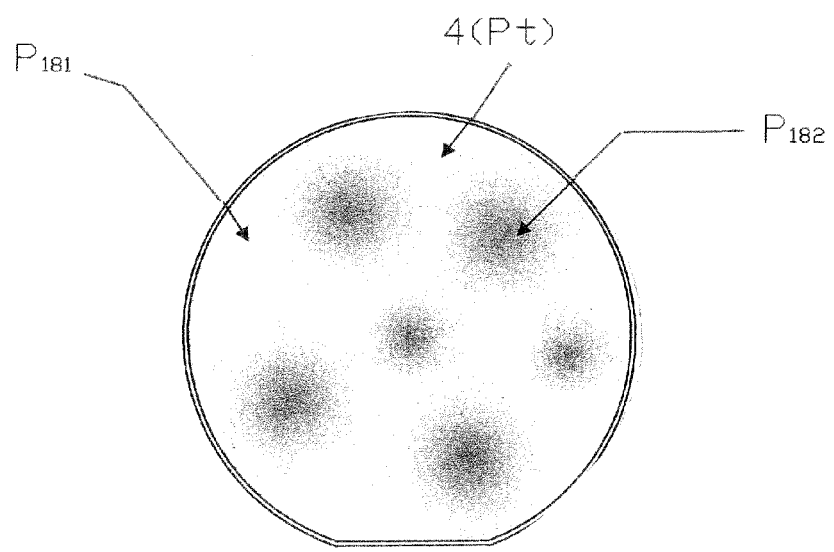
FIG. 18B is a photograph of a plan view of the Pt lower electrode layer of FIG. 10.
Figure 19A:
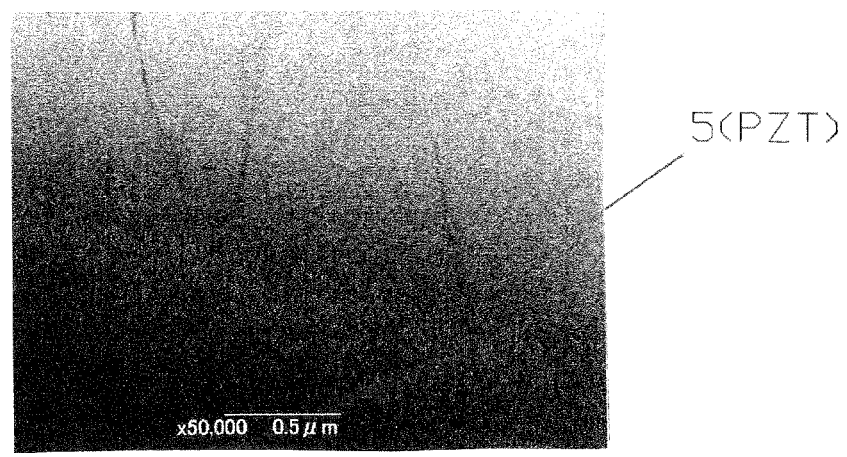
FIG. 19A is a scanning electron microscope (SEM) photograph illustrating a cross section of the PZT piezoelectric layer of FIG. 10.
Figure 19B:
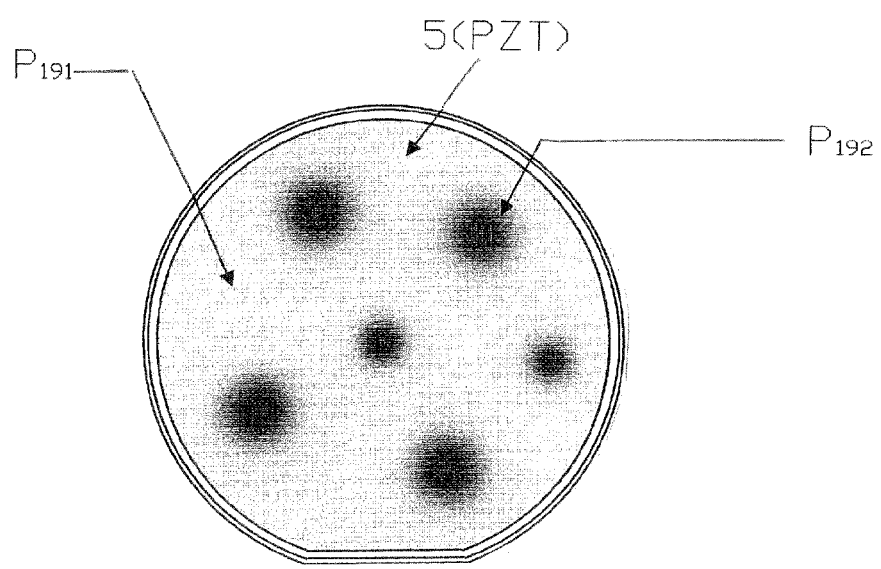
FIG. 19B is a photograph of a plan view of the PZT piezoelectric layer of FIG. 10.
Figure 20:
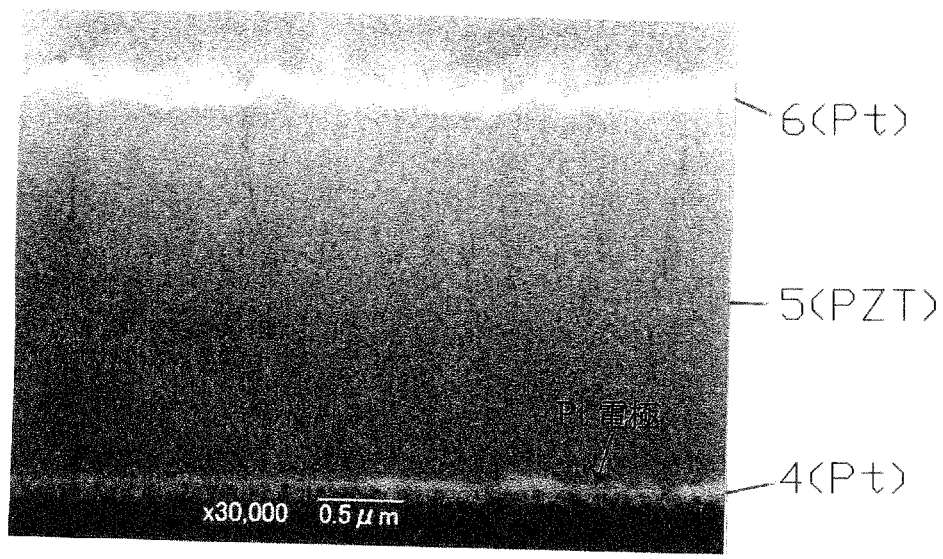
FIG. 20 is a scanning electron microscope (SEM) photograph illustrating a cross section of the Pt tower electrode layer, the PZT piezoelectric layer and the Pt upper electrode layer of FIG. 10.

Also, as illustrated in FIG. 6 which corresponds to FIG. 18A, the crystallizability of the Pt lower electrode layer 4 hardly fluctuates so that the surface roughness would be decreased. Also, as illustrated in FIG. 18B, the crystallizability of the Pt lower electrode layer 4 within one wafer hardly fluctuates. Therefore, the columnar crystallizability of the PZT piezoelectric layer 5 hardly fluctuates. Also, the piezoelectric constant $(-d_{31})$ of the PZT piezoelectric layer 5 within one wafer hardly fluctuates. Further, as illustrated in FIG. 7 corresponding to FIG. 20, the surface roughness of the Pt upper electrode layer 6 hardly fluctuates. Therefore, when a DC voltage is applied between the Pt lower electrode layer 4 and the Pt upper electrode layer 6, a strong electric field would be relaxed so that the breakdown voltage characteristics would improve. Thus, the manufacturing yield would be increased.

According to the inventor's experiment, in the PZT piezoelectric layer 5 of the prior art piezoelectric actuator of FIG. 10, the deviation $D(-d_{31}$ within one wafer was ±16%, and
the deviation $D(-d_{31})$ within one lot was ±21%. Contrary to this, in the PZT piezoelectric layer 5 of the piezoelectric actuator or FIG. 1,
the deviation $D(-d_{31})$ within one wafer was and ±3% and
the deviation $D(-d_{31})$ within one lot was ±3%. Thus, a remarkable improvement was confirmed in the re mentioned embodiment.

It will be apparent to those skilled in the art that various modifications and variations can be made in the presently disclosed subject matter without departing from the spirit or scope of the presently disclosed subject, matter. Thus, it is intended that the presently disclosed subject matter covers the modifications and variations of the presently disclosed subject, matter provided they come within the scope of the appended claims and their equivalents. All related or prior art references described above and in the Background section of the present specification are hereby incorporated in their entirety by reference.

The invention claimed is:

1. A piezoelectric actuator comprising:
    a substrate;
    an insulating layer formed on said substrate;
    a $TiO_x$ adhesive layer formed on said insulating layer having a composition x of from 0 to 2;
    a Pt lower electrode layer formed on said $TiO_x$ adhesive layer; and
    a PZT piezoelectric layer formed on said Pt lower electrode layer,
    said composition x being graded so that said composition x on the side of said insulating layer is larger than said composition x on the side of said Pt lower electrode layer.

2. The piezoelectric actuator as set forth in claim 1, wherein said composition x is continuously graded.

3. The piezoelectric actuator as set forth in claim 1, wherein a difference between a maximum value and a minimum value of said composition x within said $TiO_x$ adhesive layer is larger than 0.3.

4. The piezoelectric actuator as set forth in claim 1, wherein said composition x on the side of said insulating layer is close to 2, and said composition x on the side of said Pt lower electrode layer is close to 0.

5. The piezoelectric actuator as set forth in claim 1, wherein said composition x on the side of said insulating layer is from 1.4 to 2, and said composition x on the side of said Pt lower electrode layer is from 0 to 1.45.

6. A method for manufacturing a piezoelectric actuator comprising:
    forming an insulating layer on a substrate;
    forming a $TiO_x$ adhesive on said insulating layer by a sputtering process using oxygen gas in such a way that a flow rate of said oxygen gas is decreased from a start timing of said sputtering process to an end timing of said sputtering process; and
    forming a Pt lower electrode layer is said $TiO_x$ adhesive layer; and
    forming a PZT piezoelectric layer on said Pt lower electrode layer.

7. The method as set forth in claim 6, wherein the flow rate of said oxygen gas in said $TiO_x$ adhesive layer forming is continuously decreased.

8. The method as set forth in claim 6, further comprising:
    heating said substrate, said insulating layer, said $TiO_x$ adhesive layer and said Pt lower electrode layer in an oxygen atmosphere before forming said PZT piezoelectric layer.

\* \* \* \* \*